United States Patent [19]
Mino et al.

[11] Patent Number: 5,116,638
[45] Date of Patent: May 26, 1992

[54] ORGANIC ELECTRO-CONDUCTIVE THIN FILMS AND PROCESS FOR PRODUCTION THEREOF

[75] Inventors: Norihisa Mino, Settsu; Kazufumi Ogawa, Hirakata, both of Japan

[73] Assignee: Matsushita Electric Industrial Co., Ltd., Osaka, Japan

[21] Appl. No.: 476,829

[22] Filed: Feb. 8, 1990

[30] Foreign Application Priority Data

Feb. 15, 1989 [JP] Japan .................. 1-36858

[51] Int. Cl.$^5$ .................. B05D 3/06; B05D 5/06; H01C 1/00; H01C 1/06
[52] U.S. Cl. .................. 427/54.1; 252/500; 252/501.1; 252/502; 252/511; 252/512; 427/12; 427/35; 427/36; 427/53.1; 427/58
[58] Field of Search .............. 252/500, 501, 502, 511, 252/512; 427/35, 36, 53.1, 54.1, 58, 12

[56] References Cited

U.S. PATENT DOCUMENTS

| | | | |
|---|---|---|---|
| 4,968,524 | 11/1990 | Ogawa et al. | 427/54.1 |
| 5,008,127 | 4/1991 | Ogawa | 427/54.1 |
| 5,035,782 | 7/1991 | Tarumura et al. | 427/54.1 |

FOREIGN PATENT DOCUMENTS

| | | |
|---|---|---|
| 0178606 | 4/1986 | European Pat. Off. . |
| 0260152 | 3/1988 | European Pat. Off. . |
| 0299678 | 1/1989 | European Pat. Off. . |
| 0312100 | 4/1989 | European Pat. Off. . |
| 0341697 | 11/1989 | European Pat. Off. . |
| 0399677 | 11/1989 | European Pat. Off. . |
| 0351092 | 1/1990 | European Pat. Off. . |
| 3625009 | 3/1987 | Fed. Rep. of Germany . |

OTHER PUBLICATIONS

Soviet Physics Uspekhi, vol. 31, No. 7, Jul. 1988, New York, US, pp. 623-644; L. M. Blinov: "Lanqmuir Films".

*Primary Examiner*—A. Lionel Clingman
*Assistant Examiner*—William S. Parks
*Attorney, Agent, or Firm*—Stevens, Davis, Miller & Mosher

[57] ABSTRACT

The present invention relates to electrical and optical materials, and particularly to organic electro-conductive thin films exhibiting electro-conductivity and non-linear optical effect, and to process for the production thereof.

Further, the above properties and effects depend predominantly on the orientation of molecules constituting the films, and therefore the present invention is for control of the orientation.

2 Claims, 3 Drawing Sheets

ORGANIC ELECTRO-CONDUCTIVE THIN FILMS AND PROCESS FOR PRODUCTION THEREOF

BACKGROUND OF THE INVENTION

The present invention relates to electrical and optical materials, and to organic electro-conductive thin films exhibiting electro-conductivity and non-linear optical effects and the process for production thereof.

The following is the explanation about conventional techniques, taking the case of polyacetylene.

Because polymers of acetylene derivatives having $\pi$ electron conjugation system exhibit electro-conductivity and non-linear optical effects, the polymers are being widely investigated a electrical and optical functional materials.

As a conventional polyacetylene production method, a polymerization method using a catalyst, called "Shirakawa method," has been well-known.

On the other hand, amphoteric acetylene derivatives having both of hydrophilic group(s) and hydrohobic group(s) can form monomolecular films, which are ultrathin films in angstrom order, and its built-up films, using the Langmuir-Blodgett technique. Therefore, polyacetylene is well investigated with Langmuir-Blodgett technique.

Next, the issues to be solved by the invention are explained, taking the case of polyacetylene. With conventional polyacetylene production methods using catalysts, represented by Shirakawa method, the forming direction of polyacetylene molecules cannot be controlled. Therefore, stretching methods, liquid crystal magnetic field methods or other technique are attempted. As the stretching methods are a dynamic orientation control method and the technique gives polyacetylene some tension, the technique is not preferable. The liquid crystal magnetic field technique utilizes the orientation condition of liquid crystal; however, it is impossible to allow all molecules to orient. Moreover, the technique is limited in the kind of material on which it can be used. In addition, with conventional techniques, the chain length of polymer is short and hyperconjugated molecules cannot be formed. Therefore, to date, there has been little success using either the molecule orientation control techniques or long chain polymer forming techniques.

SUMMARY OF THE INVENTION

Organic electro-conductive thin films and a process for production thereof in the present invention comprise a substrate provided with grooves on the surface and an organic thin film composed mainly of organic compound molecules having a straight-chain hydrocarbon group and which is formed on the substrate's surface. The thin films and the process of the present invention are further characterized chemical bondings are formed between the mutual organic compound molecules having a straight-chain hydrocarbon group, and between the substrate surface and the organic compound molecules having a straight-chain hydrocarbon group, said chemical bondings between the mutual organic compound molecules having a straight-chain hydrocarbon group being super-long conjugated bondings by mutual functional groups formed in the organic compound molecules having a straight-chain hydrocarbon group.

The substrate used in the present invention is provided with grooves on its surface. In the case that organic thin films composed mainly of organic compound molecules having a straight-chain hydrocarbon group are formed on surface of the substrate, and change depending on depth of grooves provided on the substrate to a position of the organic compound molecules having a straight-chain hydrocarbon group of the grooves is limited. Therefore, when functional groups formed in the organic compound molecules having a straight-chain hydrocarbon group are mutually polymerized under the above condition, the functional groups formed in the organic compound molecules having a straight-chain hydrocarbon group existing on different depth of the grooves cannot react with each other but the polymerization reaction will take place only between the mutual functional groups formed in organic compound molecules having a straight-chain hydrocarbon group existing on the same depth of the grooves. As a result, organic electro-conductive thin films can be formed by polymerization between the mutual functional groups formed in organic compound molecules having a straight-chain hydrocarbon group existing on the same depth of the grooves, and the forming direction of polyacetylene can be controlled.

1, 10 ... substrate, 2 ... groove, 3 ... organic compound molecules having a straight-chain hydrocarbon group, 4, 17 ... polyacetylene, 11, 15 ... silicon oxide film, 13 ... V-shape grooved surface, 14 ... V-shape grooved silicon substrate, 16 ... monomolecular film.

DETAILED DESCRIPTION OF THE PREFERRED EMBODIMENTS

Figure 1:
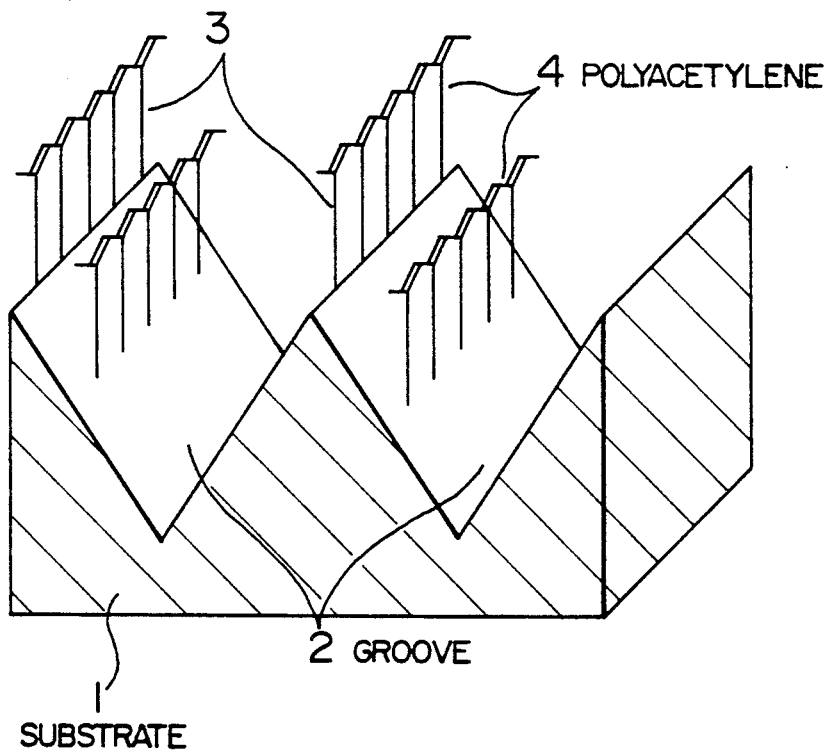
FIG. 1 is a diagrammatic oblique illustration showing the example of the present invention's organic electro-conductive thin film.
Figure 2A:
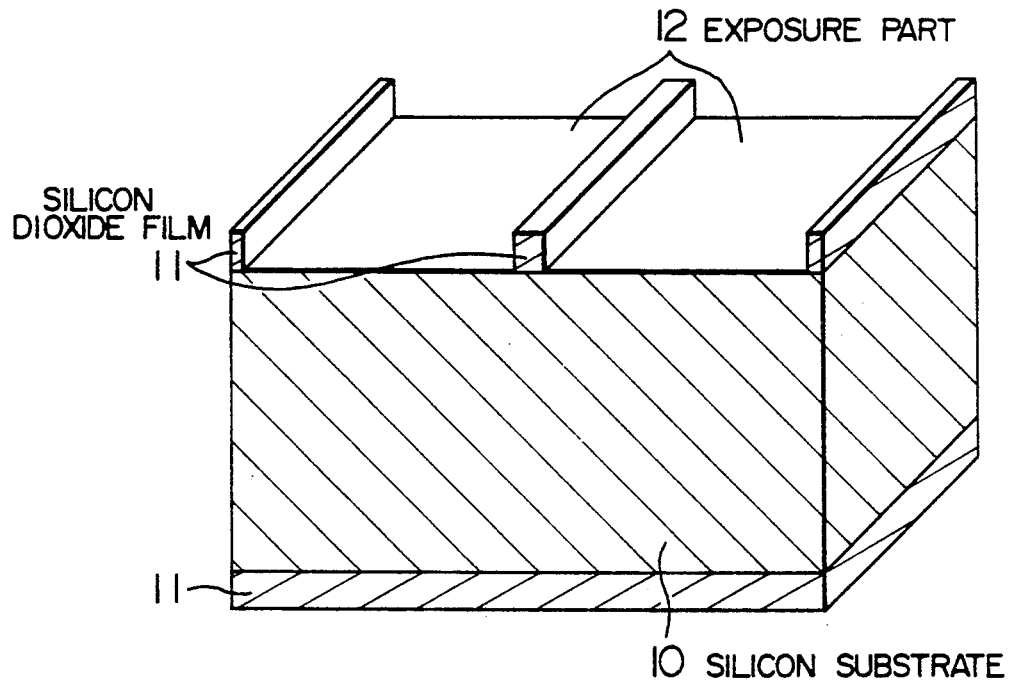
FIG. 2 is an oblique illustration exhibiting the process for production of the present invention's organic electro-conductive thin film by stage.
Figure 2B:
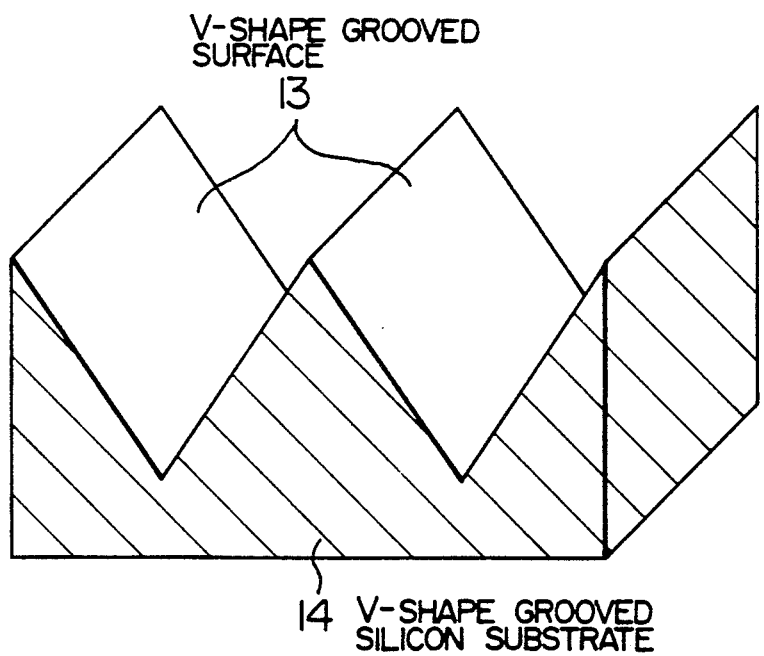
Figure 2C:
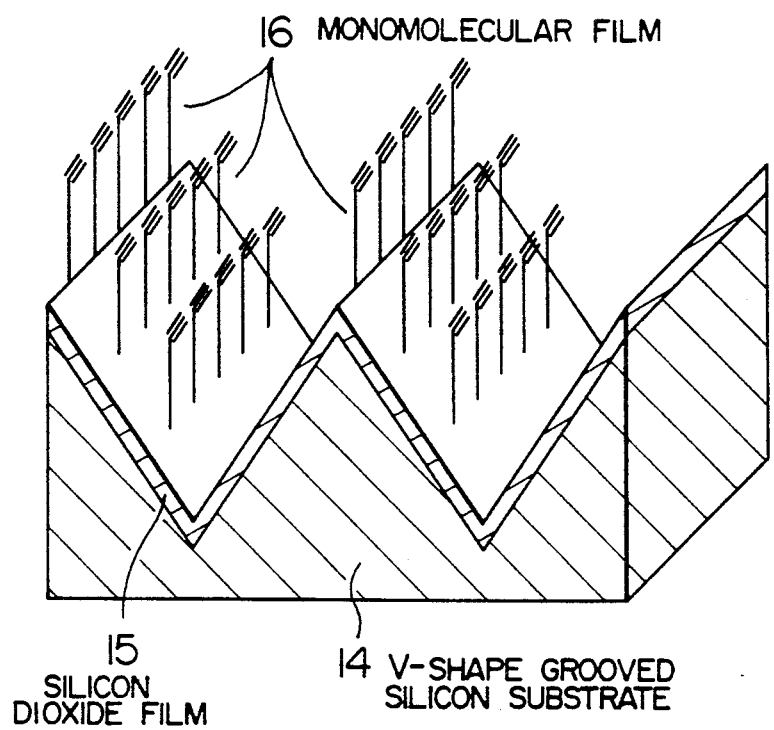
Figure 2D:
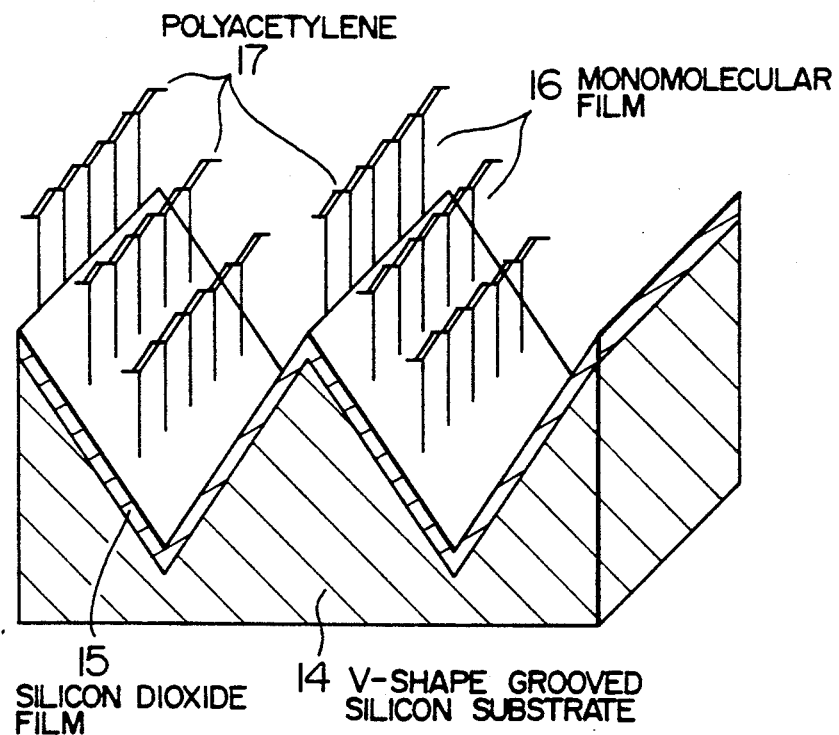

An example of organic electro-conductive thin films in the present invention is explained using FIG. 1 in the following explanation.

1 shows a substrate for forming an organic electro-conductive thin film. 2 shows grooves formed on the substrate 1. 3 shows organic compound molecules having a long-chain hydrocarbon group. Acetylene groups are formed on long-chain hydrocarbon groups in the organic compound molecules 3, and polyacetylene 4 is obtained through polymerization.

The following is an explanation about an organic electro-conductive thin film constituted in the above composition. V-shape grooves 2 are formed on the substrate 1 for forming organic electro-conductive film. The organic compound molecules 3 having long-chain hydrocarbon groups form thin films along the grooves 2 on the substrate 1. The acetylene groups are formed on long-chain hydrocarbon groups in the organic compound molecules 3, as a functional group, and polyacetylene 4 is formed through polymerization. To avoid the complexity of illustration, the number of organic compound molecules 3 having long-chain hydrocarbon groups, which form thin films along the grooves 2, is represented at least in FIG. 1. As acetylene groups are located on a specific part in organic compound molecules 3 having long-chain hydrocarbon groups, the acetylene groups cannot polymerize perpendicularly against V-shape grooves, and polyacetylene 4 is always formed parallel to the V-shape grooves. Therefore, polyacetylene is formed in a specific direction, which differs from conventional two-dimensional electro-conductivity, so that there is an advantage that one-dimensional electric wiring pattern can be used. Further in the example, an acetylene group is used as a functional group to add electro-conductivity; however, it is evident that other functional groups including diacetylene group can be also used.

Moreover, in the example, a long-chain alkyl group is used as a long-chain hydrocarbon group of organic compound molecules; however, other general long-chain hydrocarbon groups can be also used.

Next, an example of the process for production of the present invention's organic electro-conductive thin films is stepwise explained using FIG. 2.

At first, silicon oxide film 11 measuring 500 nm in thickness is formed using silicon substrate 10 having the surface of <100> side, as a substrate. At this time, silicon dioxide film is also formed on the reverse side of the silicon substrate 10. Then photoresist is applied on the silicon dioxide film formed on the reverse side of the silicon substrate 10, and is coated the reverse side. And then using a photolithographic method, the silicon dioxide film 11 on the silicon substrate 10 is etched partially and the exposure part 12 of the silicon substrate is obtained. The pattern width of the silicon dioxide film 11 is preferred at less than 1 micrometer. Further, silicon oxide film can be etched in any width (FIG. 2(A)).

Then, the exposure part 12 of the silicon substrate conducted anisotropic etching with etching solution. As an etching solution, hydrazine etching solution is used. With the etching treatment, the V-shape grooved surface 13 is formed. The grooved surface 13 is <111> side.

A little underetching occurs under the silicon oxide film 11. After this, silicon oxide film is removed with hydrofluoric acid to form silicon substrate 14 having V-shape grooves (FIG. 2 (B)).

Next, silicon oxide film 15 is formed on the V-shape grooved silicon substrate 14. The film can be formed in any thickness. Then the V-shape grooved silicon substrate 14 is immersed in a solution having organic compound molecule which have long-chain hydrocarbon groups such as an organic compound having trichlorosiryl group at the terminal and an acetylene group at the terminal of the long-chain hydrocarbon group, are dissolved in a solvent, such as n-hexadecane. With the immersion, monomolecular film 16 constituted by organic compound molecules having a long-chain hydrocarbon group is formed on the V-shape grooved silicon substrate. In FIG. 2 (C) and (D), to avoid the complexity of illustration, the number of organic compound molecules having a long-chain hydrocarbon group forming thin film along the surface of V-shape grooves 13 is represented at least (FIG. 2 (C)). Further, in the example, an organic compound having an acetylene group at the terminal position of a long-chain hydrocarbon group is used; however, any organic compounds having a long-chain hydrocarbon group which has an acetylene group at the other position can also be used.

Further, acetylene groups in organic compound molecules having a long-chain hydrocarbon group constituting of monomolecular film 16, are polymerized with an electron beam irradiation method, to form polyacetylene 17 (FIG. 2 (D)).

As above-mentioned, an organic electro-conductive thin film is formed. The obtained polyacetylene is polymerized along V-shape grooves and has one-dimensional direction. Therefore, its electro-conductivity also exhibits one-dimensional direction.

In the example, the <111> side is used as a V-shape surface; however, other sides can be also used, such as <111> side. In addition, <111> side and <111> side can be jointly used as a V-shape surface.

Further, in the example, hydrazine is used as anisotropic etching solution, so it is evident that other anisotropic etching solution can also be used.

In addition, in the example, an electron beam is used for polymerization of acetylene; however, other polymerization techniques, such as a catalyst polymerization technique, can also be used.

Further, in the example, polyacetylene is formed by acetylene groups; however, other functional groups, such as diacetylene group, may also be used to form polydiacetylene.

In addition, in the example, a long-chain alkyl group is used as a long-chain hydrocarbon group of an organic compound's molecule; however, other general long-chain hydrocarbon groups can also be used.

The present invention does not concern conventional organic thin films having two-dimensional electro-conductivity, but organic thin films exhibiting one-dimensional electro-conductivity and the process for production thereof.

Therefore, it is possible to use the organic electro-conductive thin films of the present invention to form electric wiring patterns, and the present invention provides significant technical advantages in forming organic functional devices.

In addition, as organic electro-conductive thin films and the process for production thereof in the present invention can form an electric wiring pattern into not only a special direction but also any directions, in photolithographic pattern forming treatment. The films and the process produce great effects in forming organic functional devices.

Further, as a one-dimensional configuration of organic compound molecules can be constituted by the process for production thereof of the present invention, the process is applied to not only organic electro-conductive thin films in the present invention, but also to other application fields, such as organic non-linear optical thin films.

We claim:

1. A process for producing an organic electroconductive thin film, which comprises the steps of: providing grooves on a substrate by an anisotropic process, forming an organic thin film, which is composed of an organic compound molecule having a straight-chain hydrocarbon group and terminal groups, on the substrate surface by means of chemical adsorption, conducting the mutual polymerization between functional groups in the organic compound molecules having a straight-chain hydrocarbon group under irradiation of an energy beam selected from the group consisting of ultraviolet ray, extreme far ultraviolet ray, electron beam and x-ray, or by a catalytic polymerization reaction in the presence of a transition metal of Group V or VI of the Periodic Table as a catalyst, wherein one of the terminal groups of said organic compound molecule which has a straight-chain hydrocarbon group is a mono-, di- or tri-chlorosilane group, and the functional groups in said organic compound molecules which have a straight-chain hydrocarbon group of 8 to 25 carbon atoms are double bonded or triple bonded.

2. A process for producing an organic electroconductive thin film according to claim 1, wherein said functional groups in the organic compound molecules which have a straight-chain hydrocarbon group of 8 to 25 carbon atoms are unsaturated groups containing acetylene group or diacetylene group.

* * * * *